US008447576B2

(12) United States Patent
Staples et al.

(10) Patent No.: US 8,447,576 B2
(45) Date of Patent: May 21, 2013

(54) SYSTEM AND METHOD FOR PRODUCING EDITABLE THREE-DIMENSIONAL MODELS

(75) Inventors: Daniel C. Staples, Cape Elizabeth, ME (US); Ravikanth Vootukuri, Madison, AL (US)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 727 days.

(21) Appl. No.: 12/604,530

(22) Filed: Oct. 23, 2009

(65) Prior Publication Data

US 2011/0098983 A1   Apr. 28, 2011

(51) Int. Cl.
*G06G 7/48*   (2006.01)
(52) U.S. Cl.
USPC ............................................. 703/7; 345/420
(58) Field of Classification Search
USPC ............... 703/6, 7; 707/4; 382/154; 345/419, 345/420, 781
See application file for complete search history.

(56) References Cited

U.S. PATENT DOCUMENTS

| | | | |
|---|---|---|---|
| 5,701,403 A | 12/1997 | Boh | |
| 5,745,117 A | 4/1998 | Masuda | |
| 2001/0043209 A1* | 11/2001 | Nagakura | 345/419 |
| 2001/0043236 A1* | 11/2001 | Yamamoto | 345/781 |
| 2002/0089499 A1* | 7/2002 | Lee et al. | 345/419 |
| 2004/0249809 A1* | 12/2004 | Ramani et al. | 707/4 |
| 2005/0225551 A1* | 10/2005 | Shimizu et al. | 345/419 |
| 2008/0100616 A1* | 5/2008 | Yamazaki et al. | 345/420 |
| 2008/0297503 A1* | 12/2008 | Dickinson et al. | 345/420 |
| 2009/0160856 A1* | 6/2009 | Hoguet | 345/420 |
| 2010/0092072 A1* | 4/2010 | Guntur | 382/154 |

OTHER PUBLICATIONS

Nemetschek AG. Neu in Allplan 2003, 2002 (p. 135); Magazine (1 page).
PCT Invitation to Pay Additional Fees dated Feb. 3, 2011 corresponding to PCT Patent Application No. PCT/US2010/053099 filed Oct. 19, 2010 (9 pages).
PCT International Search Report dated Apr. 11, 2011 corresponding to PCT Patent Application No. PCT/US2010/053099 filed Oct. 19, 2010 (22 pages).

* cited by examiner

*Primary Examiner* — Kandasamy Thangavelu

(57) ABSTRACT

A method and related CAD system and computer readable medium for creating a dimensioned object model in a CAD system, including automatically associating editable dimensions with an object model in the CAD system. The method includes receiving 2D CAD data, the 2D CAD data including dimension information, and creating a 3D model corresponding to the 2D CAD data. The method also includes associating the dimension information with features of the 3D model and storing the 3D model and associated dimension information in the CAD system. The dimension information can thereafter be edited to automatically produce corresponding changes in the 3D model. Other methods are also described.

27 Claims, 5 Drawing Sheets

SYSTEM AND METHOD FOR PRODUCING EDITABLE THREE-DIMENSIONAL MODELS

TECHNICAL FIELD

The present disclosure is directed, in general, to computer aided design, drafting, manufacturing, and visualization systems (individually and collectively, "CAD systems").

BACKGROUND OF THE DISCLOSURE

CAD systems are often required to process both two-dimensional (2D) and three-dimensional (3D) representations.

SUMMARY OF THE DISCLOSURE

Disclosed embodiments include a method and related CAD system and computer readable medium for creating a dimensioned object model in a CAD system, including automatically associating editable dimensions with an object model in the CAD system. The method includes receiving 2D CAD data, the 2D CAD data including dimension information, and creating a 3D model corresponding to the 2D CAD data. The method also includes associating the dimension information with features of the 3D model and storing the 3D model and associated dimension information in the CAD system. The dimension information can thereafter be edited to automatically produce corresponding changes in the 3D model.

Various embodiments also include another method and related CAD system and computer readable medium. The method can automatically create a dimensioned object model in a CAD system. The method includes receiving a 3D CAD model and corresponding 2D CAD data, the 2D CAD data including dimension information, and mapping the dimension information to the 3D CAD model, by the CAD system. The method includes associating the mapped dimension information with features of the 3D CAD model, and storing the 3D CAD model and associated dimension information in the CAD system. The dimension information can thereafter be edited to automatically produce corresponding changes in the 3D model.

Other embodiments, variations, and features are disclosed.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 1:
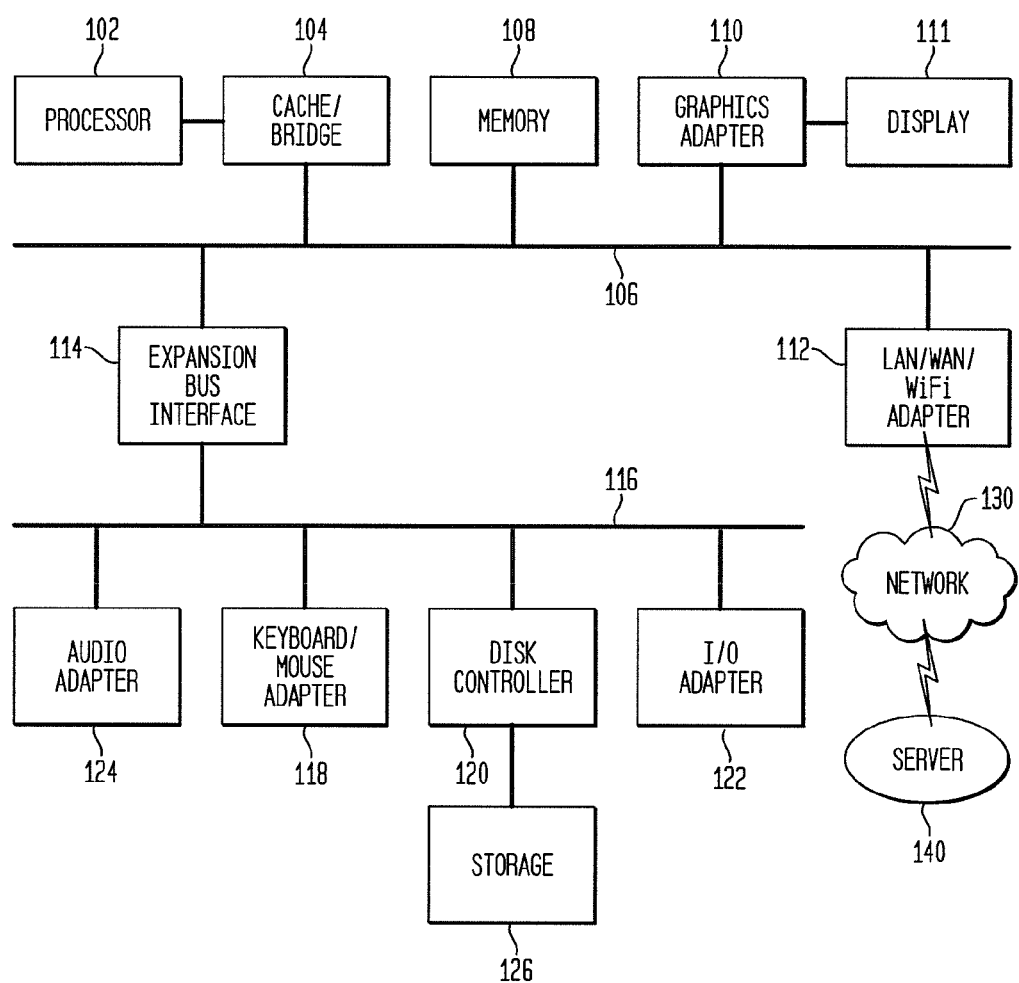
FIG. 1 depicts a block diagram of a data processing system in which an embodiment can be implemented.

FIGS. 1 through 7, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Many users are migrating to 3D CAD systems from previous generation 2D CAD systems. Some 3D CAD systems use a method of "folding up" the 2D geometry of the part to form the basis of a 3D solid model. However, even after user intervention to extrude or revolve the geometry, the result is a "dumb" solid model, because it is just a model created from the geometry. There is no persistent dimensional information automatically applied to the model, nor is the "design intent" of the dimensioning scheme carried forward. This limits the usefulness of creating 3D models from 2D geometry, because extra steps are required to add dimensional values and to provide the ability to edit the model to make a revision.

An additional problem of some CAD systems is that when users migrate from a 3D system to another 3D system, they can transfer "dumb" solid geometry between the two systems as bodies, but they cannot transfer editable intelligent bodies. Additionally, the 2D drawing becomes dissociated from the part during the transfer. Thus, there is no longer an associative relationship between the model and the drawing. The CAD systems and methods described herein are able to create editable, dimensioned, 3D models from 2D-model data, and able to transfer solid models between systems and generate a fully editable solid, with a fully associative drawing.

FIG. 1 depicts a block diagram of a data processing system in which an embodiment can be implemented, for example as a CAD system. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Figure 2:
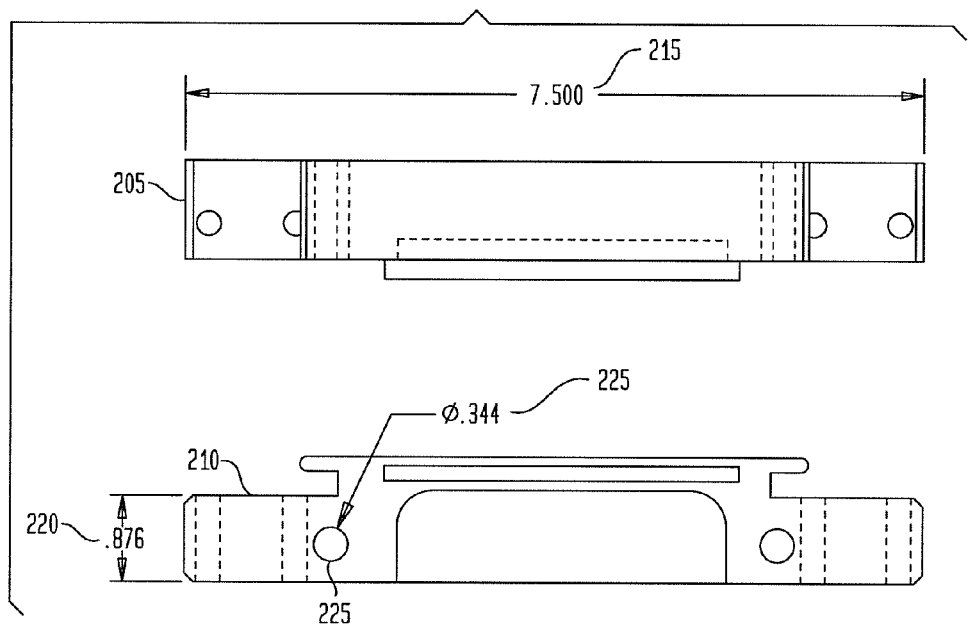
FIG. 2 depicts two aspects of a 2D drawing of a simple part, in accordance with various embodiments.

FIG. 2 depicts two aspects of a 2D drawing of a simple part, in both a side view 205 and a top view 210. Note that the 2D drawing includes dimensions, in this example, including a first dimension 215 that can represent the length of the part, a second dimension 220 that can represent the thickness of the main body of the part, and a third dimension 225 that can represent the diameter of the indicated hole in the part. In practice, of course, more sophisticated drawings can be used with dozens or hundreds of appropriate dimensions. While those of skill in the art do not necessarily or consistently refer to these drawings as "2D drawings", as used herein, "2D drawing" is intended to refer to any representation of an object that is not a CAD solid object or associated data.

Figure 3:
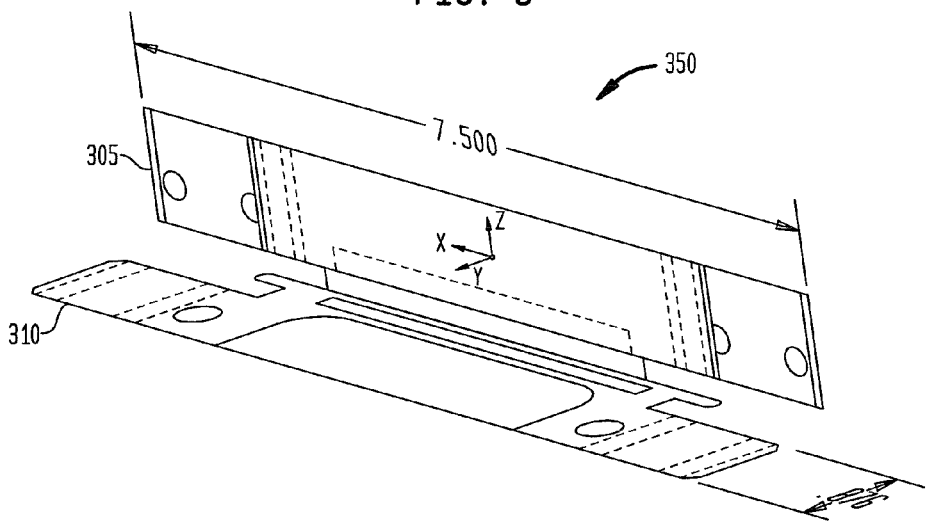
FIG. 3 depicts a 3D representation of a part, in accordance with various embodiments.

FIG. 3 depicts a 3D representation of a part as shown in FIG. 2, where the side view 205 and top view 210 have been "folded up" to represent 3D part 350 by two sides. Side view 205 becomes folded side 305, and top view 210 becomes the orthogonal folded side 310. In a typical system, while the dimensions from the "folded" drawing may still be shown in the image, they are "detached"; that is, they are not associated with the sides and do not actually constrain or define any dimensions of the CAD objects.

Figure 4:
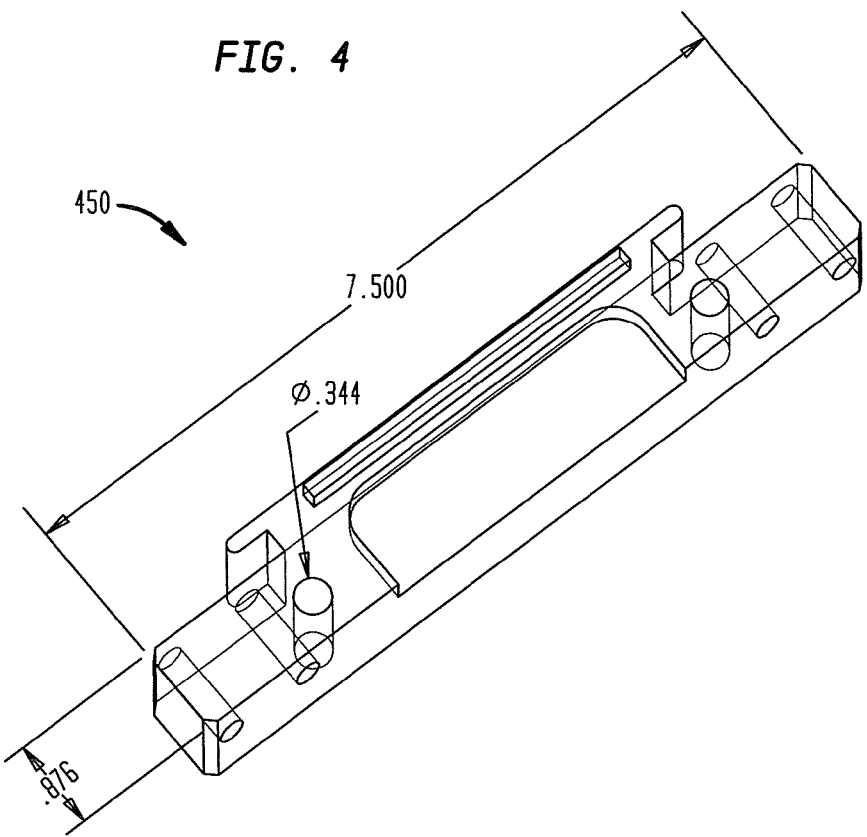
FIG. 4 depicts a 3D object produced in accordance with various embodiments.

FIG. 4 depicts a 3D object as produced according to disclosed embodiments, where the CAD system and method produce a completed solid model 450 with fully editable dimensions attached, that corresponds to the 2D drawing of FIG. 2. The dimension figures are associated with the solid model 450 and can be edited as, for example, a fully parametric 3D object. Note that "attached" dimensions, as used herein, means that the dimension figures are associated with the respective side, edge, or other feature so as to accurately reflect the relative size of the feature, and changes to the size are reflected in a change to the dimension figure and vice versa. While the terms "drawing" and "model" are used herein, those of skill in the art will appreciate that this does not only refer to the graphical or visual representation of the drawing or model, but also the underlying CAD data used my by the system to represent the drawing or model.

Figure 5:
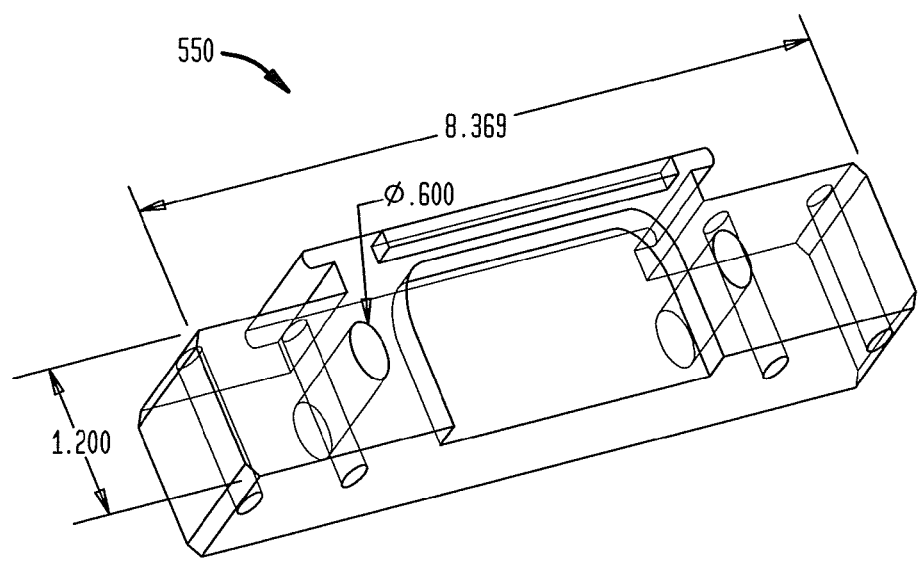
FIG. 5 depicts a 3D solid model, in accordance with various embodiments.

FIG. 5 depicts a 3D solid model 550 corresponding to solid model 450, where the dimensions have been edited to change the part size. This is not possible in conventional systems, and illustrates a clear technical advantage of the disclosed system and method.

Of course, FIGS. 2-5 are merely examples of a drawings and models that can be used or produced by the disclosed systems and methods, and do not limit the disclosed embodiments. In other embodiments, the input to the process is a 3D model as described above, without associated dimensions, and can also be used to create a 3D solid model with editable dimensions, as described below.

For the 2D to 3D use-case, because the quantity of data to be migrated to 3D may be hundreds of thousands of drawings, the time savings and productivity increase in creating editable, dimensioned, 3D models from this data can be worth tens or hundreds of thousands of dollars in savings in a commercial context, as a result of being able to leverage existing customer data effectively. For the 3D to 3D use-case, the disclosed embodiments can exchange solid models between systems and generate a fully editable solid, with a fully associative drawing.

Figure 6:
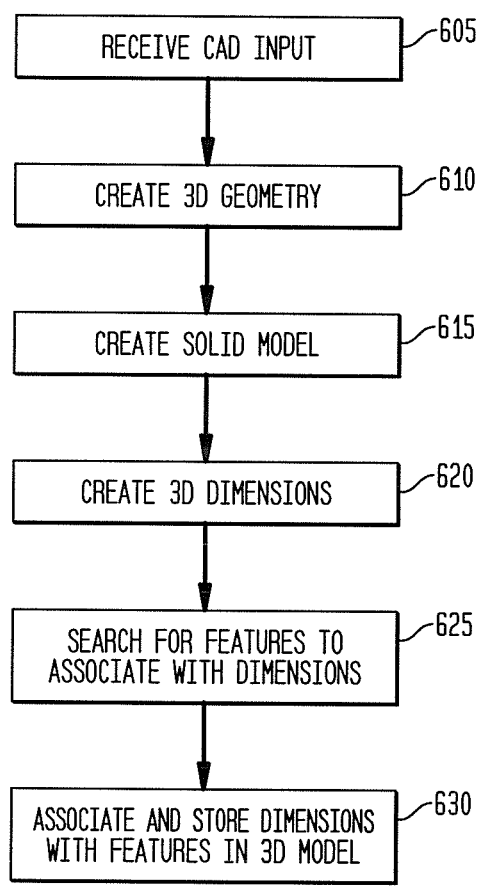
FIG. 6 depicts a flowchart of a process in accordance with various embodiments.

FIG. 6 depicts a flowchart of a process in accordance with various embodiments, assuming a 2D geometry as input. First, CAD input as a 2D drawing is received by and stored in the CAD system in 2D drawing format, including at a plurality of sides or views so that at least a 3D wireframe can be modeled (step 605). In most cases, the 2D drawing includes dimensions, but of course the dimension data can be received separately. Typically, this model is by the CAD system from an originating system. As used herein, "receiving" in this context includes receiving the appropriate data from another system, loading it from storage, a user input, or other processes for obtaining the data for processing as described.

Next, according to various embodiments, the system "folds up" folding up the 2D drawing to produce a 3D wireframe geometry, stored in the CAD system, using techniques known to those of skill in the art (step 610). The system can then create a corresponding 3D solid model (step 615), for example via an interaction with a user, and store it in the CAD system.

The disclosed system and method "folds up" the dimensions from the 2D drawing as well, creating counterpart 3D CAD or product manufacturing information (PMI) dimensions corresponding to the 3D wireframe or solid geometry (step 620) and stores this data in the 3D model. As described herein, this step can take place at a different point in the process, and in particular, can take place concurrently with step 610, above. Once the dimensions are in the proper locations in the 3D model, they area in a "detached" state.

The CAD system then performs a process of searching for solid geometry with which the dimensions will be associated (step 625) by identifying features of the solid geometry that correspond to the 2D drawings and dimension information. At the "target point" for the extension line of each end of a linear dimension, or the "arrow point" for a radial or diameter dimension, the system will search for a 3D edge or vertex to associate with the dimension. If this is not found, the dimension remains detached, but the system will search when future modeling operations are performed. In this manner, the searching process can be ongoing; even if the system cannot initially find a proper geometry with which to associate the dimension, if and when a proper geometry does appear in the right place, for example by a user adding or changing a feature, the system can then automatically associate or "attach" the dimension to the proper geometry.

If the corresponding geometry is found, the system will associate the dimension with the found 3D geometry, either in the 3D wireframe geometry on in the 3D solid model (step 630), and store the association in the CAD system as part of the 3D model. Once the dimension is associated to a particular geometry, the dimension becomes a "driving" dimension, capable of editing the size and shape of the solid model when its value is changed. The reverse is also true in various embodiments, wherein if the geometry is edited directly, the associated dimension is updated accordingly.

Figure 7:
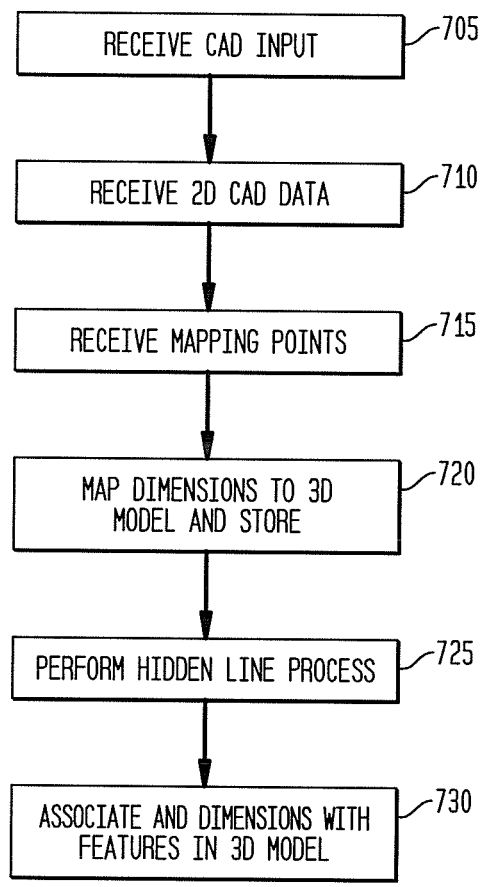
FIG. 7 shows a flowchart of a process performed by a system for a 3D solid model input, in accordance with various embodiments.

FIG. 7 shows a flowchart of a process performed by a system for a 3D solid model input, in accordance with various embodiments. First, CAD input as a solid model is received by and stored in the CAD system in solid model format (step 705). Typically, this model is translated from an originating system to be received by CAD system.

The CAD system receives and stores a 2D CAD data such as a drawing, corresponding to the received solid model (step 710). Typically, this drawing is one that was created in an originating system from the solid model and is translated into the CAD system drawing format. This drawing can be 2D and includes 2D dimension data.

The CAD system receives, for example from a user, key mapping points between the 2D drawing and the 3D solid model (step 715) and stores this in the CAD system.

The CAD system maps the 2D dimension data onto the 3D model (step 720), including associating each dimension with a corresponding feature of the 3D model, and stores the mapping. Because the solid model already exists and the drawing exactly correlates to it (since it was derived from it in the originating system), the dimensions should all be able to be associated with corresponding features of the existing solid.

In some embodiments, the system performs a hidden line process to produce drawing views of the solid model (step 725), and stores the result. As part of this step, the system can then replace the geometry in the views on the drawing with the new drawing views and attach the dimensions to the new views, and/or create a new drawing and retrieve the 3D CAD dimensions from step 720 into the drawing.

Various embodiments include a CAD system and corresponding method of creating dimensions capable of driving the shape or position of surface or solid models. Such a method can include receiving a drawing with geometry and dimensions as input; mapping the geometry and dimensions into a 3D space; creating a surface or solid from the geometry in the 3D space; and associating the dimensions to features of the surface or solid model.

Various embodiments include a CAD system and corresponding method of creating a dimensionally-driven surface or solid model. Such a method can include receiving a 3-dimensional surface or solid model and its corresponding drawing as input; mapping dimensions from said drawing into the 3D space of said surface or solid model; and associating the dimensions with features of said solid model.

Various embodiments include a CAD system and corresponding method of creating an associative drawing from an existing solid model and previously associated drawing. Such a method can include receiving a 3-dimensional surface or solid model and its previously corresponding drawing as input; creating a mapping between the existing drawing geometry, including dimension data, and the 3D surface or solid model; deriving views of the surface or solid model, similar to those in the drawing; replacing the drawing geometry with the views of the model, using the previously computed mapping; and attaching the existing dimensions to the new views of the surface or solid model.

Various embodiments include a CAD system and corresponding method of creating a fully associative drawing from an existing solid model and previously associated drawing. Such a method can include receiving a 3-dimensional surface or solid model and its corresponding drawing as input; mapping dimensions from said drawing into the 3D space of said surface or solid model; attaching said dimensions to said surface or solid model; creating a drawing and deriving drawing views of the surface or solid model on said drawing; and creating corresponding dimensions from said 3D space in said drawing.

Those of skill in the art will recognize that, except in cases where the manipulation of data necessarily requires a specific order of operations, the steps of the various processes described above may be performed in a different order, or various steps can be performed concurrently. Further, unless specifically indicated as necessary or specifically claimed below, various steps can be omitted in various embodiments.

Other systems that perform various CAD-related functions are described, for example, in U.S. Pat. Nos. 4,912,657, 5,745,117, 6,308,144, 5,649,076, and 5,668,939, all of which are hereby incorporated by reference.

The various embodiments disclosed herein provide a significant technical advantage and advance in the CAD industry. The disclosed embodiments enable users and system to create fully editable 3D solid models from existing 2D drawings, and to migrate from one 3D system to another without losing model editability or drawing associativity.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of a instructions contained within a machine-usable, computer-usable, or computer-readable medium in any of a variety of forms, and that the present disclosure applies equally regardless of the particular type of instruction or signal bearing medium or storage medium utilized to actually carry out the distribution. These instructions, when executed, can cause a data processing system to perform a method as disclosed herein. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method for creating a dimensioned object model in a CAD system, comprising:
    receiving 2D CAD data by a CAD system, the 2D CAD data including dimension information;
    creating a 3D model corresponding to the 2D CAD data, by the CAD system;
    associating, by the CAD system, the dimension information with features of the 3D model, including searching the 3D model for vertices and edges to associate with respective dimensions of the dimension information; and
    storing the 3D model and associated dimension information in the CAD system, wherein editing the dimension information automatically produces corresponding changes in the 3D model, and wherein editing the 3D model directly automatically produces corresponding changes in the associated dimension information.

2. The method of claim 1, wherein the 3D model is created by folding up multiple sides of a 2D representation in the CAD data.

3. The method of claim 1, wherein the 2D CAD data is a plurality of side views of an object represented in 2D drawings.

4. The method of claim 1, wherein the 3D model is a 3D wireframe geometry.

5. The method of claim 1, wherein the 2D CAD data is a plurality of side views of an object represented in 2D drawings and the dimension information is associated with the features of the 3D model by identifying features of the 3D model that correspond to the 2D drawings and dimension information.

6. A method for creating a dimensioned object model in a CAD system, comprising:
    receiving a 3D CAD model and corresponding 2D CAD data by a CAD system, the 2D CAD data including dimension information;
    mapping the dimension information to the 3D CAD model, by the CAD system, including searching the 3D model for vertices and edges to associate with respective dimensions of the dimension information;
    associating, by the CAD system, the mapped dimension information with features of the 3D CAD model; and
    storing the 3D CAD model and associated dimension information in the CAD system, wherein editing the dimension information automatically produces corresponding changes in the 3D model, and wherein editing the 3D model directly automatically produces corresponding changes in the associated dimension information.

7. The method of claim 6, further comprising performing a hidden line process to produce drawing views of the 3D CAD model, replacing the 2D CAD data and the dimension information.

8. The method of claim 6, wherein the 2D CAD data is a plurality of side views of an object represented in 2D drawings corresponding to the received 3D CAD model.

9. The method of claim 6, further comprising receiving, by the CAD system and from a user, key mapping points between the 2D CAD data and the 3D CAD model.

10. A CAD system comprising a processor and accessible memory, the CAD system particularly configured to perform the steps of:
    receiving 2D CAD data, the 2D CAD data including dimension information;
    creating a 3D model corresponding to the 2D CAD data;
    associating the dimension information with features of the 3D model, including searching the 3D model for vertices and edges to associate with respective dimensions of the dimension information; and
    storing the 3D model and associated dimension information, wherein editing the dimension information automatically produces corresponding changes in the 3D model, and wherein editing the 3D model directly automatically produces corresponding changes in the associated dimension information.

11. The CAD system of claim 10, wherein the 3D model is created by folding up multiple sides of a 2D representation in the CAD data.

12. The CAD system of claim 10, wherein the 2D CAD data is a plurality of side views of an object represented in 2D drawings.

13. The CAD system of claim 10, wherein the 3D model is a 3D wireframe geometry.

14. The CAD system of claim 10, wherein the 2D CAD data is a plurality of side views of an object represented in 2D drawings and the dimension information is associated with the features of the 3D model by identifying features of the 3D model that correspond to the 2D drawings and dimension information.

15. A CAD system comprising a processor and accessible memory, the CAD system particularly configured to perform the steps of:
 receiving a 3D CAD model and corresponding 2D CAD data, the 2D CAD data including dimension information;
 mapping the dimension information to the 3D CAD model, including searching the 3D model for vertices and edges to associate with respective dimensions of the dimension information;
 associating the mapped dimension information with features of the 3D CAD model; and
 storing the 3D CAD model and associated dimension information, wherein editing the dimension information automatically produces corresponding changes in the 3D model, and wherein editing the 3D model directly automatically produces corresponding changes in the associated dimension information.

16. The CAD system of claim 15, further configured to perform a hidden line process to produce drawing views of the 3D CAD model, replacing the 2D CAD data and the dimension information.

17. The CAD system of claim 15, wherein the 2D CAD data is a plurality of side views of an object represented in 2D drawings corresponding to the received 3D CAD model.

18. The CAD system of claim 15, further configured to receive, from a user, key mapping points between the 2D CAD data and the 3D CAD model.

19. A computer readable medium encoded with instructions that, when executed, cause a data processing system to perform the steps of:
 receiving 2D CAD data, the 2D CAD data including dimension information;
 creating a 3D model corresponding to the 2D CAD data;
 associating the dimension information with features of the 3D model, including searching the 3D model for vertices and edges to associate with respective dimensions of the dimension information; and
 storing the 3D model and associated dimension information, wherein editing the dimension information automatically produces corresponding changes in the 3D model, and wherein editing the 3D model directly automatically produces corresponding changes in the associated dimension information.

20. The computer readable medium of claim 19, wherein the 3D model is created by folding up multiple sides of a 2D representation in the CAD data.

21. The computer readable medium of claim 19, wherein the 2D CAD data is a plurality of side views of an object represented in 2D drawings.

22. The computer readable medium of claim 19, wherein the 3D model is a 3D wireframe geometry.

23. The computer readable medium of claim 19, wherein the 2D CAD data is a plurality of side views of an object represented in 2D drawings and the dimension information is associated with the features of the 3D model by identifying features of the 3D model that correspond to the 2D drawings and dimension information.

24. A non-transitory computer readable medium encoded with instructions that, when executed, cause a data processing system to perforin the steps of:
 receiving a 3D CAD model and corresponding 2D CAD data, the 2D CAD data including dimension information;
 mapping the dimension information to the 3D CAD model, including searching the 3D model for vertices and edges to associate with respective dimensions of the dimension information;
 associating the mapped dimension information with features of the 3D CAD model; and
 storing the 3D CAD model and associated dimension information, wherein editing the dimension information automatically produces corresponding changes in the 3D model, and wherein editing the 3D model directly automatically produces corresponding changes in the associated dimension information.

25. The computer readable medium of claim 24, further encoded with instructions to cause the data processing system to perform a hidden line process to produce drawing views of the 3D CAD model, replacing the 2D CAD data and the dimension information.

26. The computer readable medium of claim 24, wherein the 2D CAD data is a plurality of side views of an object represented in 2D drawings corresponding to the received 3D CAD model.

27. The computer readable medium of claim 24, further encoded with instructions to cause the data processing system to receive, from a user, key mapping points between the 2D CAD data and the 3D CAD model.

* * * * *